(12) United States Patent
Li et al.

(10) Patent No.: US 7,212,395 B2
(45) Date of Patent: May 1, 2007

(54) CAPACITOR DESIGN FOR CONTROLLING EQUIVALENT SERIES RESISTANCE

(75) Inventors: Yuan-Liang Li, Chandler, AZ (US); David G. Figueroa, Tolleson, AZ (US); Farzaneh Yahyaei-moayyed, Chandler, AZ (US); Dong Zhong, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 11/024,060

(22) Filed: Dec. 28, 2004

(65) Prior Publication Data

US 2006/0139847 A1    Jun. 29, 2006

(51) Int. Cl.
*H01G 4/228* (2006.01)

(52) U.S. Cl. .............................. 361/306.1; 361/306.3; 361/301.3; 361/303; 361/321.1; 361/313; 361/308.3

(58) Field of Classification Search ............. 361/306.1, 361/306.2, 306.3, 303, 321.2, 321.1, 301.3, 361/308.1, 308.3
See application file for complete search history.

(56) References Cited

U.S. PATENT DOCUMENTS

| | | | | |
|---|---|---|---|---|
| 5,880,925 A * | 3/1999 | DuPre et al. | ............... | 361/303 |
| 6,266,226 B1 * | 7/2001 | Hayashi | ..................... | 361/303 |
| 6,370,011 B1 * | 4/2002 | Naito et al. | .............. | 361/306.1 |
| 6,407,904 B1 * | 6/2002 | Kuroda et al. | .............. | 361/303 |
| 6,418,030 B1 * | 7/2002 | Yamaguchi et al. | ........ | 361/760 |
| 6,583,981 B2 * | 6/2003 | Moriwaki et al. | ....... | 361/321.2 |
| 6,900,991 B2 * | 5/2005 | Patel et al. | ................. | 361/782 |

* cited by examiner

*Primary Examiner*—Nguyen T. Ha
(74) *Attorney, Agent, or Firm*—Buckley, Maschoff & Talwalker LLC

(57) ABSTRACT

According to some embodiments, a capacitor includes a first external capacitor plane including a first at least one terminal of a first polarity, and a first internal capacitor plane including a second at least one terminal of the first polarity. The second at least one terminal of the first polarity may be electrically coupled to the first at least one terminal of the first polarity, and a total area of the second at least one terminal of the first polarity may be less than a total area of the first at least one terminal of the first polarity.

22 Claims, 8 Drawing Sheets

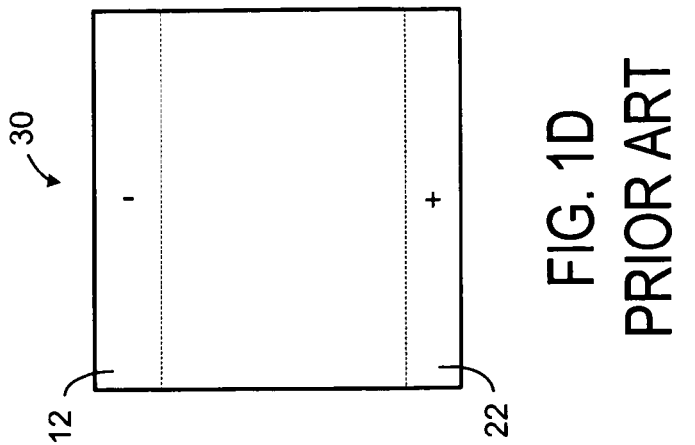
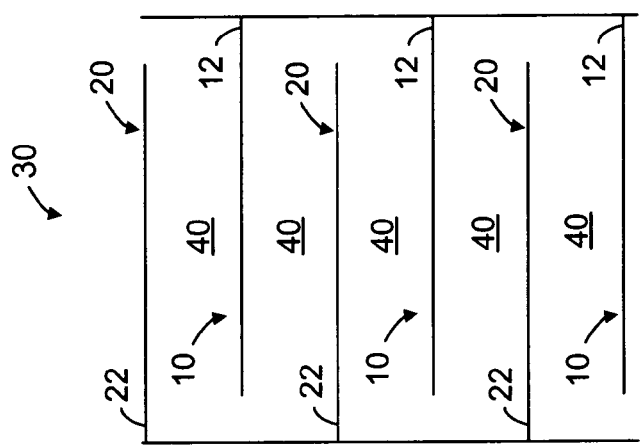
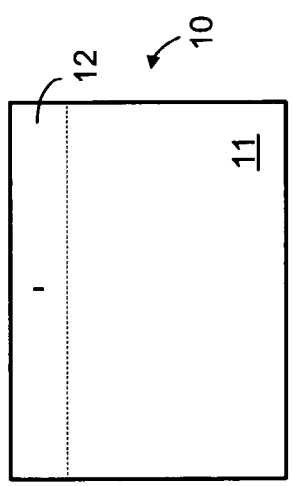

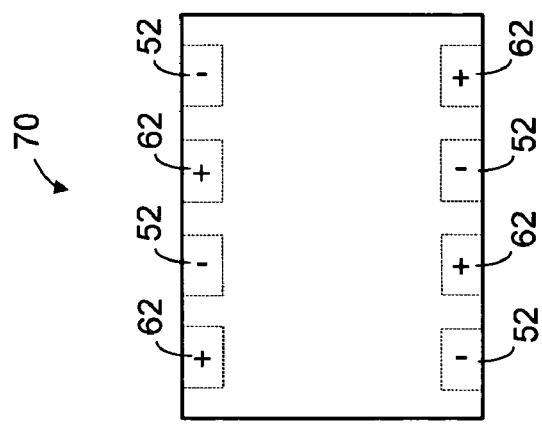
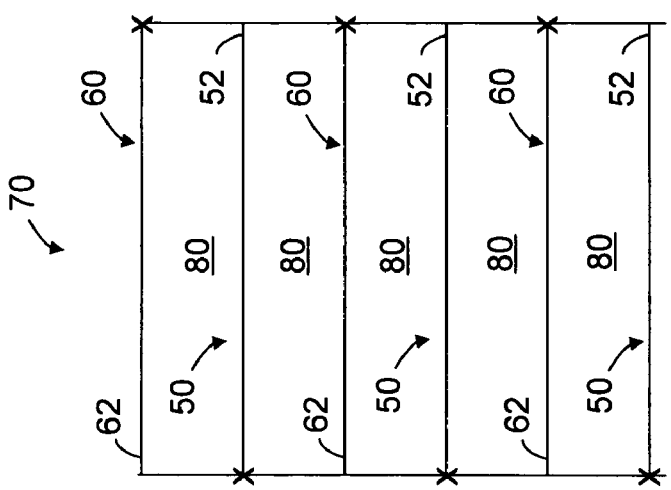
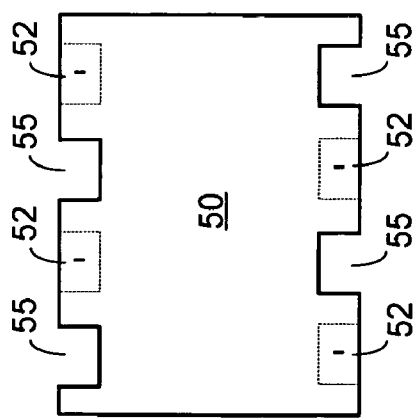
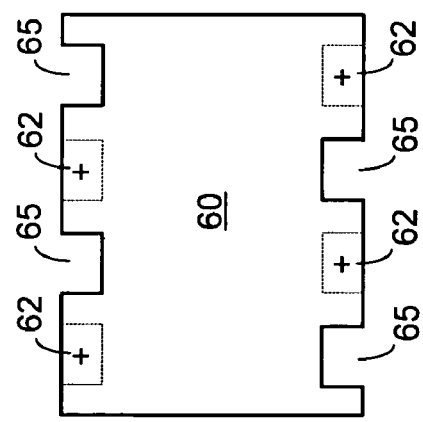

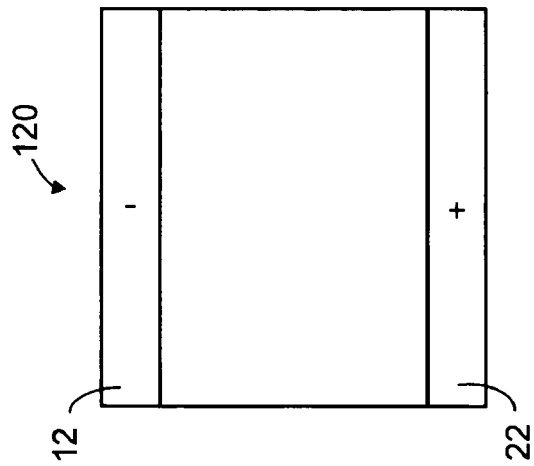
FIG. 3D
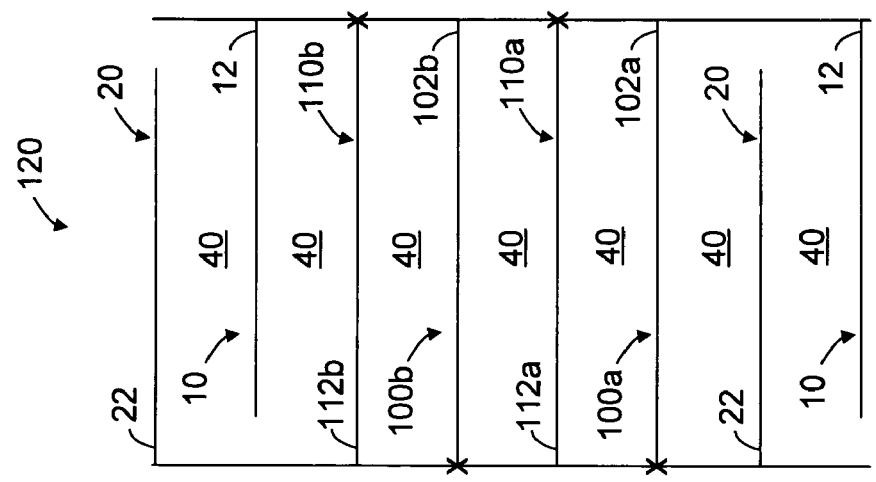
FIG. 3C
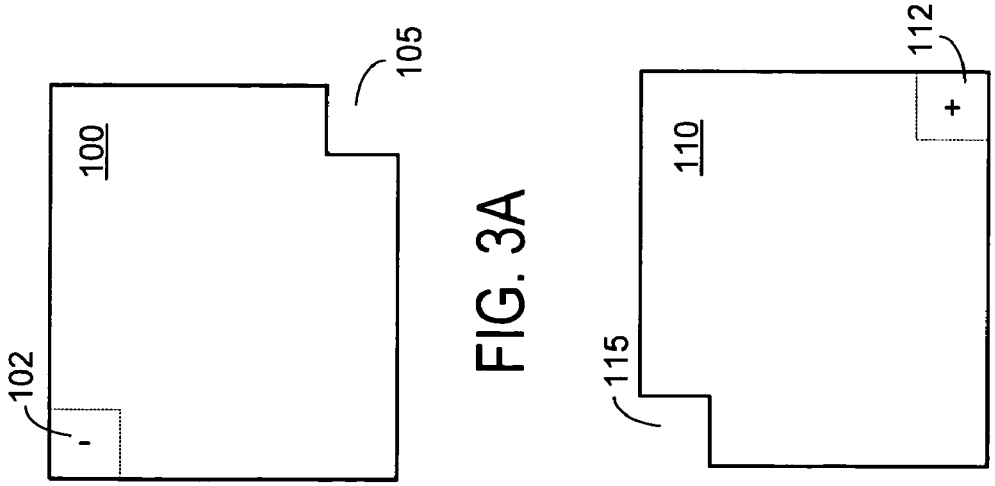
FIG. 3A
FIG. 3B

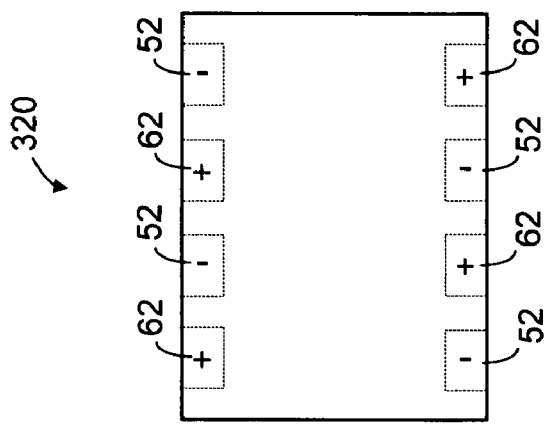
FIG. 6D
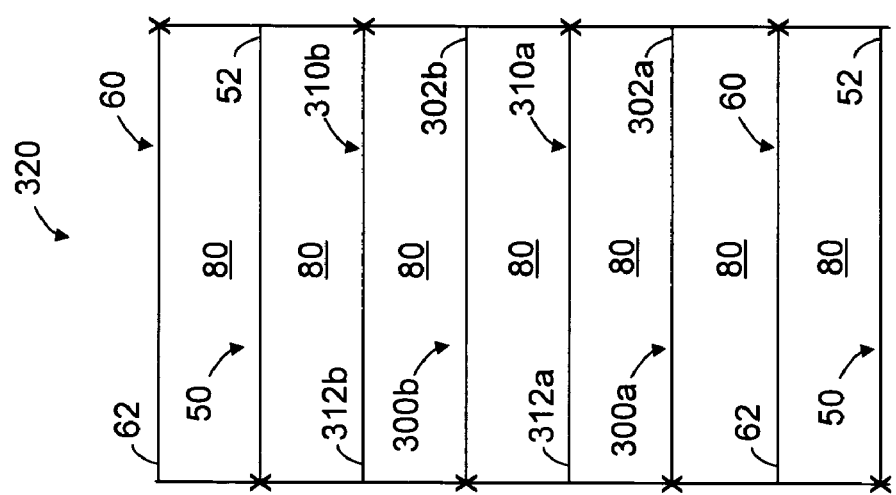
FIG. 6C
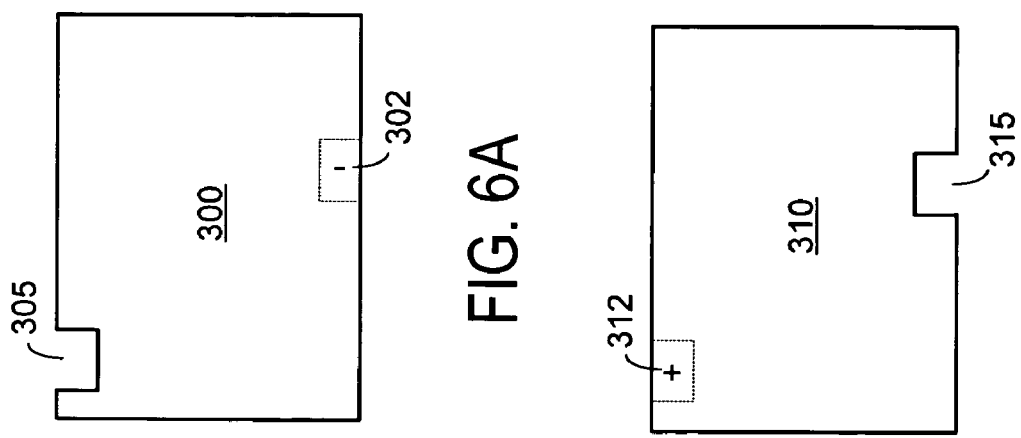
FIG. 6A
FIG. 6B

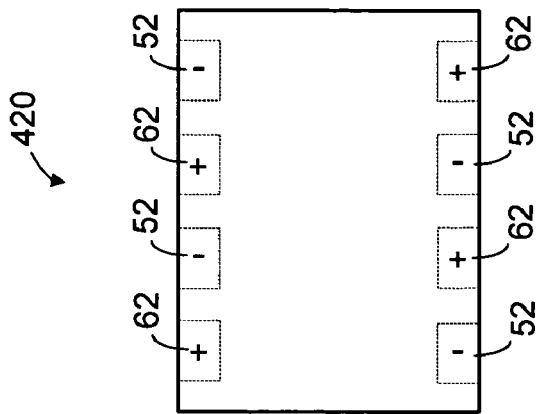
FIG. 7D
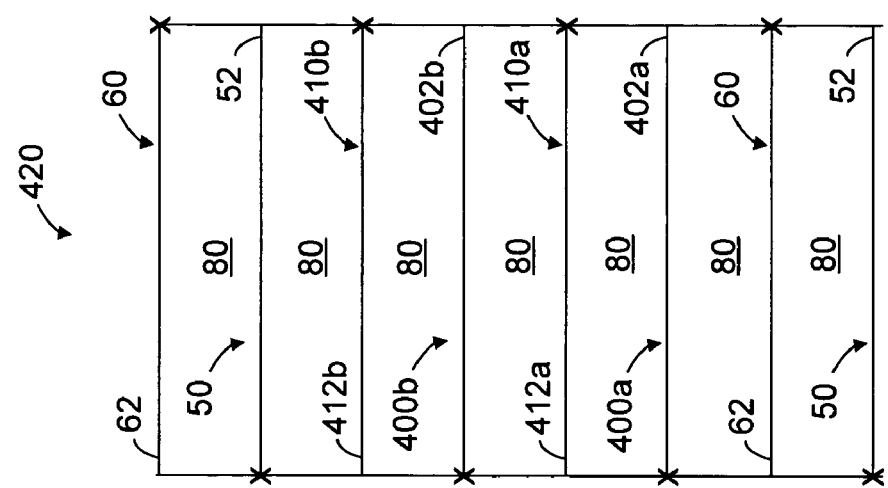
FIG. 7C
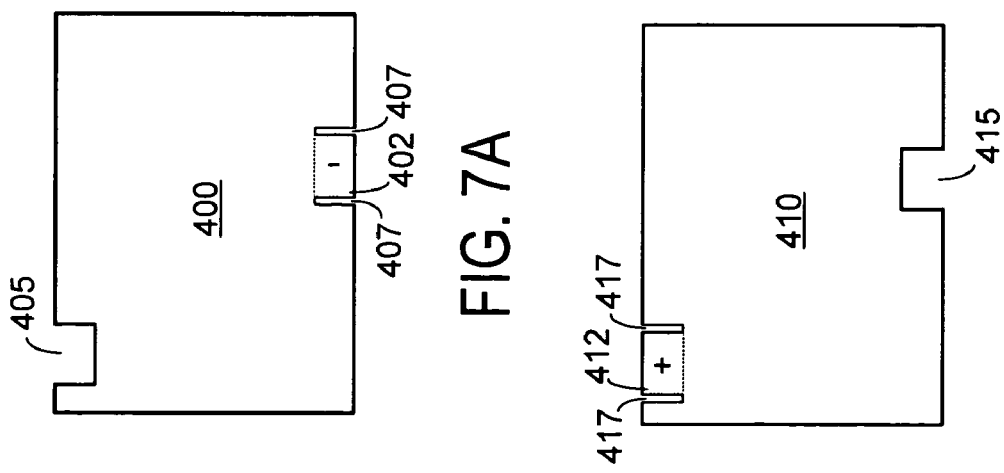
FIG. 7A
FIG. 7B

CAPACITOR DESIGN FOR CONTROLLING EQUIVALENT SERIES RESISTANCE

BACKGROUND

FIGS. 1A through 1D illustrate a conventional two-terminal capacitor. In particular, FIG. 1A is a view of negative capacitor plane 10 including negative plate 11 and negative terminal 12, and FIG. 1B is a view of positive capacitor plane 20 including positive plate 21 and positive terminal 22. FIG. 1C is a side cutaway view of capacitor 30, which shows several alternately stacked planes 10 and 20, with dielectric material 40 disposed therebetween. The negative terminals 12 of each negative plane 10 are electrically coupled, as are the positive terminals 22 of each positive plane 20. FIG. 1D is a top view of capacitor 30, showing a negative terminal 12 and a positive terminal 22 that may be coupled to an electrical circuit.

FIGS. 2A through 2D illustrate a conventional eight-terminal capacitor. FIG. 2A shows negative capacitor plane 50 including negative terminals 52 and voids 55, and FIG. 2B shows positive capacitor plane 60 including positive terminals 62 and voids 65. FIG. 2C is a side cutaway view of capacitor 70, which includes several alternately stacked planes 50 and 60, separated by dielectric material 80. The X's of FIG. 2C indicate a lack of electrical interconnection between a plane and an adjacent vertically-disposed conductor.

Each negative terminal 52 is electrically coupled to a negative terminal 52 located above and/or below it. For example, a conductor may be coupled to a negative terminal 52, pass through a void 65 located directly below the negative terminal 52, and be coupled to a negative terminal 52 located directly below the void. Each positive terminal 62 may be similarly coupled to one or more other positive terminals 62. For example, internal plane 100a is not electrically coupled to terminal 22 of the lowermost plane 20. FIG. 2D is a top view of capacitor 70, showing four negative terminals 52 and four positive terminals 62 that may be coupled to an electrical circuit.

Either or both of the foregoing capacitors may exhibit an Equivalent Series Resistance (ESR) that is unsuitable for some applications. If used as a decoupling capacitor on an integrated circuit package, for example, the ESR of either capacitor may be too low to satisfactorily dampen resonance between an integrated circuit die and a motherboard to which the package is coupled.

BRIEF DESCRIPTION OF THE DRAWINGS

FIGS. 1A and 1B are top views of respective negative and positive capacitor planes of a conventional two-terminal capacitor.

FIG. 1C is an illustrative cutaway side view of a conventional two-terminal capacitor comprising the capacitor planes of FIGS. 1A and 1B.

FIG. 1D is a top view of the FIG. 1C capacitor.

FIGS. 2A and 2B are top views of respective negative and positive capacitor planes of a conventional eight-terminal capacitor.

FIG. 2C is an illustrative cutaway side view of a conventional eight-terminal capacitor comprising the capacitor planes of FIGS. 2A and 2B.

FIG. 2D is a top view of the FIG. 2C capacitor.

FIGS. 3A and 3B are top views of respective internal negative and positive capacitor planes of a two-terminal capacitor according to some embodiments.

FIG. 3C is an illustrative cutaway side view of a two-terminal capacitor comprising the internal capacitor planes of FIGS. 3A and 3B according to some embodiments.

FIG. 3D is a top view of the FIG. 3C capacitor.

FIGS. 6A and 6B are top views of respective internal negative and positive capacitor planes of an eight-terminal capacitor according to some embodiments.

FIG. 6C is an illustrative cutaway side view of an eight-terminal capacitor comprising the internal capacitor planes of FIGS. 6A and 6B according to some embodiments.

FIG. 6D is a top view of the FIG. 6C capacitor.

FIGS. 7A and 7B are top views of respective internal negative and positive capacitor planes of an eight-terminal capacitor according to some embodiments.

FIG. 7C is an illustrative cutaway side view of an eight-terminal capacitor comprising the internal capacitor planes of FIGS. 7A and 7B according to some embodiments.

FIG. 7D is a top view of the FIG. 7C capacitor.

DETAILED DESCRIPTION

Figure 4:
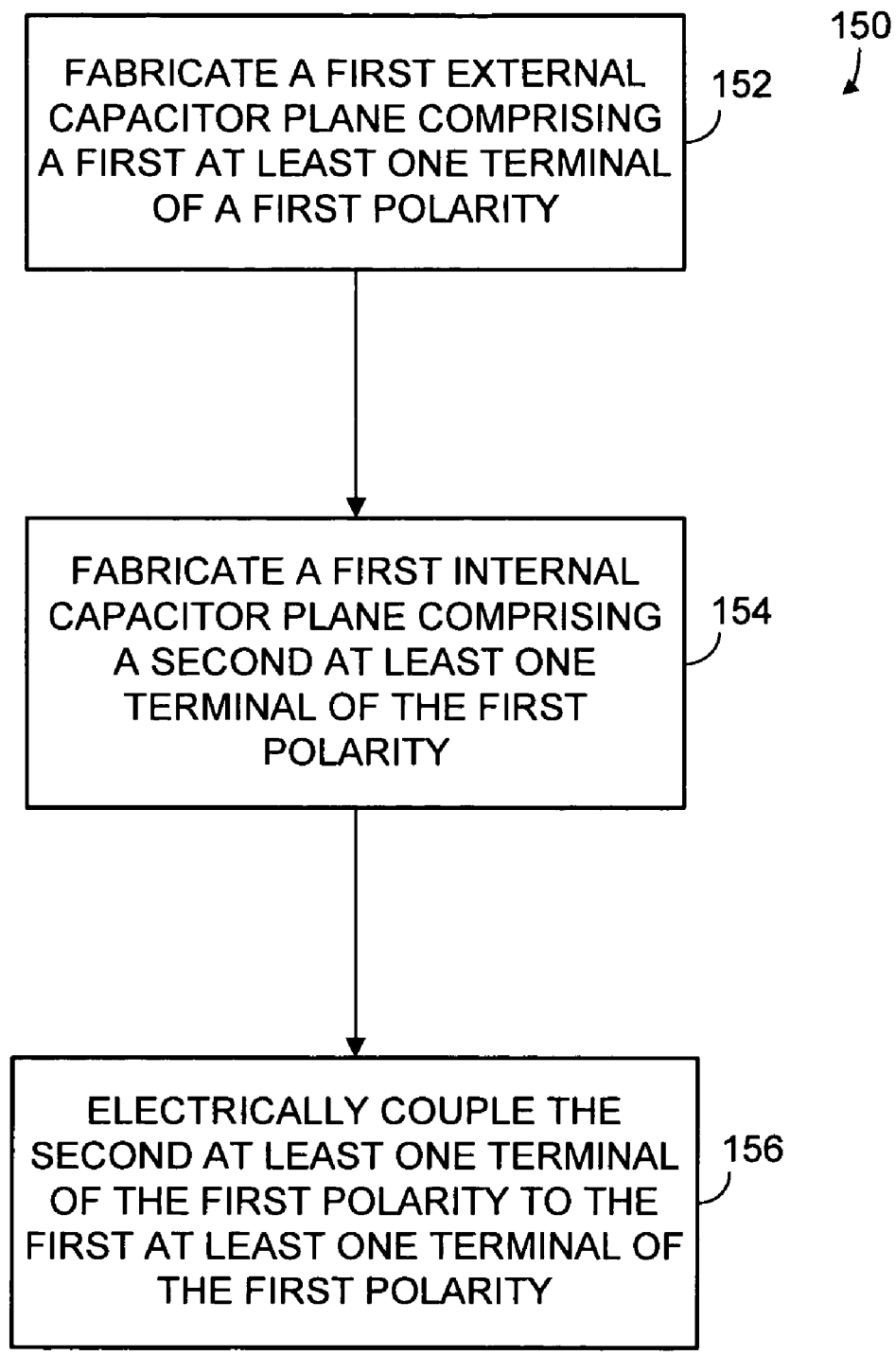
FIG. 4 is a flow diagram of a method according to some embodiments.

FIG. 3A is a top view of negative internal capacitor plane 100 according to some embodiments. Plane 100 includes negative terminal 102 and defines void 105. Positive internal capacitor plane 110 of FIG. 3B includes positive terminal 112 and defines void 115. Planes 100 and 110 may comprise any suitable currently- or hereafter-known material or materials, including but not limited to copper. Terminals 102 and 112 may comprise materials that are different, similar, or identical to non-terminal areas of their respective planes.

FIG. 3C is a side cutaway view of capacitor 120 according to some embodiments. Negative external capacitor plane 10 of FIG. 1A is disposed at the bottom of capacitor 120 and positive plane 20 of FIG. 1B is above plane 10. As previously mentioned, plane 10 includes negative terminal 12 and plane 20 includes positive terminal 22.

Internal negative capacitor plane 100a is located above plane 20 and is shown coupled to external plane 10. More specifically, terminal 102a of internal capacitor plane 100a is electrically coupled to terminal 12 of external capacitor plane 10. Internal positive capacitor plane 110a is located above plane 100a and is shown coupled to lower-most positive capacitor plane 20. Lower-most positive capacitor plane 20 is considered an external plane because its terminal 12 is externally accessible. Terminal 112a of internal capacitor plane 110a is electrically coupled to terminal 22 of capacitor plane 20. A conductor coupling terminal 112a to terminal 22 passes through void 105a (not shown) of plane 100a in order to avoid electrically coupling plane 100a to terminal 112a or terminal 22.

As shown in FIG. 1A and FIG. 3A, a total area of terminal 102a is less than a total area of terminal 12. Such a feature may contribute to capacitor 120 exhibiting a greater ESR than capacitor 30. Similarly, a total area of terminal 112a is less than a total area of terminal 22. This feature may also or alternatively increase the ESR of capacitor 120 with respect to other arrangements.

Returning to FIG. 3C, internal negative capacitor plane 100b is located between internal positive capacitor plane 110a and internal positive capacitor plane 110b. Terminal 102b of internal capacitor plane 100b is electrically coupled to terminal 102a and terminal 12 of lower-most external capacitor plane 10. Again, a conductor coupling terminal 102b to terminal 102a passes through void 115a (not shown) of plane 110a in order to avoid electrically coupling plane 110a to terminal 102a or terminal 102b.

Internal positive capacitor plane 110b is located above plane 100b and is coupled to lower-most positive capacitor plane 20 and to internal positive capacitor plane 110a. More specifically, terminal 112b of internal positive capacitor plane 110b is electrically coupled to terminal 112a of capacitor plane 110a by a conductor that passes through void 105b (not shown) of plane 100b.

Finally, upper-most external negative capacitor plane 10 and upper-most external positive capacitor plane 20 are respectively coupled to the other negative and positive capacitor planes of FIG. 3C. In some embodiments, a total area of terminal 12 of the upper-most external negative capacitor plane 10 is greater than a total area of terminal 112a or terminal 112b. Also, a total area of terminal 22 of the upper-most external positive capacitor plane 20 is greater than a total area of terminal 102a or terminal 102b.

FIG. 3D is a top view of capacitor 120. The view shows terminal 12 of an external negative capacitor plane 10 and terminal 22 of an external positive capacitor plane 20. Such terminals may be used to connect capacitor 120 to an external circuit.

FIG. 4 is a flow diagram of a method according to some embodiments. Method 150 may be executed by any combination of hardware, software and/or firmware, and some or all of method 150 may be performed manually. Portions of method 150 may be performed by different entities. For example, method 150 may be performed by any combination of an integrated circuit manufacturer, a capacitor manufacturer, and a system integrator.

Initially, a first external capacitor plane is fabricated at 151. The plane includes at least one terminal of a first polarity. According to some embodiments, plane 10 is fabricated at 151 using conventional or hereafter-known fabrication techniques. Capacitor plane 10 may comprise any suitable currently- or hereafter-known material or materials, including but not limited to copper. Terminal 12 and plate 11 may comprise different, similar, or identical materials.

A first internal capacitor is then fabricated at 154. The first internal capacitor includes a second at least one terminal of the first polarity. According to some embodiments, a total area of the second at least one terminal of the first polarity is less than a total area of the first at least one terminal of the first polarity. In one example of 154, capacitor plane 100 is fabricated. As mentioned above, a total area of negative terminal 102 is less than a total area of negative terminal 12 of plane 10.

The second at least one terminal and the first at least one terminal are electrically coupled at 156. Any suitable system for establishing a conductive path between the two terminals may be employed in conjunction with 156. In some embodiments such as that illustrated in FIG. 3C, a stack is created consisting of first external capacitor plane 10, dielectric 40, second external capacitor plane 20, dielectric 40, and first internal capacitor plane 100a. Next, terminal 12 of plane 10 is electrically coupled to terminal 102a of plane 100.

According to some embodiments of method 150, also fabricated are a second external capacitor plane comprising at least one terminal of a second polarity, and a second internal capacitor plane comprising at least one terminal of the second polarity. Referring to the above example, the second external capacitor plane may be plane 20 of FIG. 1A, and the second internal capacitor may be positive internal capacitor plane 110 of FIG. 3B. Terminals of the second internal plane and the second external plane may be electrically coupled and assembled in conjunction with the first internal and external planes as described above with respect to FIG. 3C.

Figure 5D:
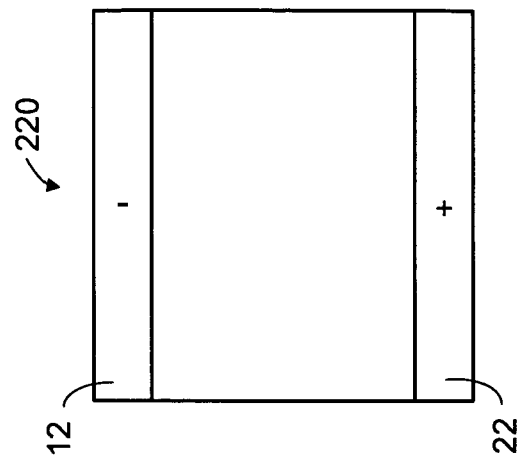
FIG. 5D is a top view of the FIG. 5C capacitor.
Figure 5C:
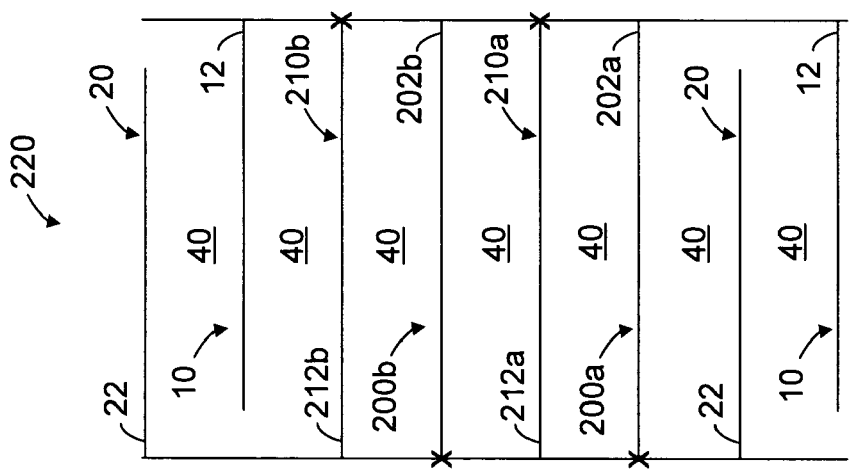
FIG. 5C is an illustrative cutaway side view of a two-terminal capacitor comprising the internal capacitor planes of FIGS. 5A and 5B according to some embodiments.
Figure 5A:
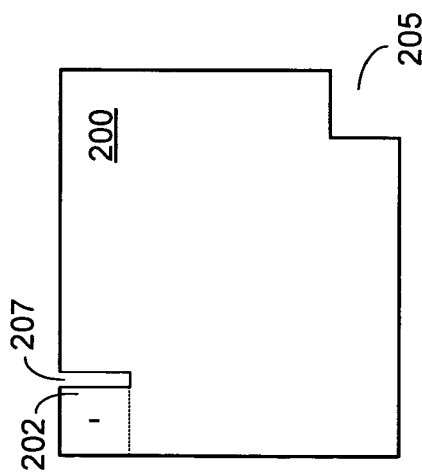
FIGS. 5A and 5B are top views of respective internal negative and positive capacitor planes of a two-terminal capacitor according to some embodiments.
Figure 5B:
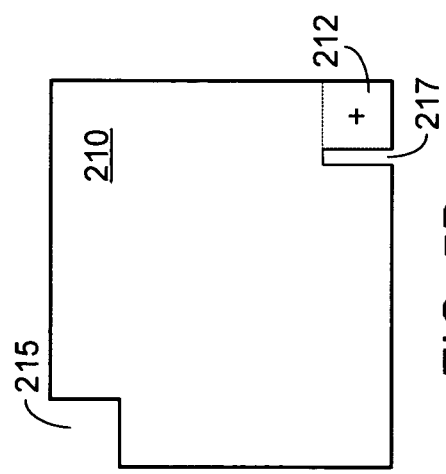
Figure 8:
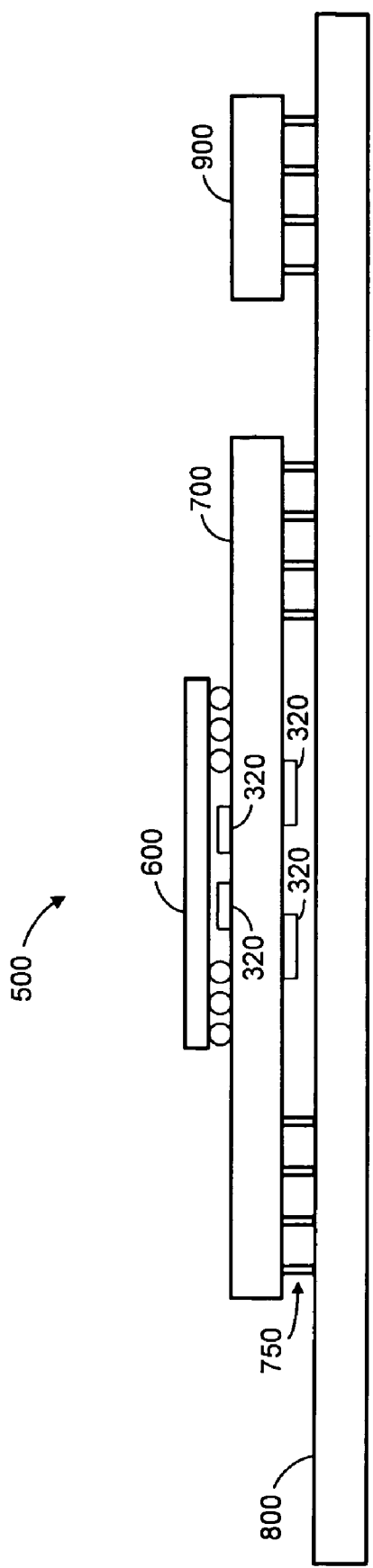
FIG. 8 is a cutaway side elevation of a system according to some embodiments.

FIG. 5A and FIG. 5B illustrate internal capacitor planes 200 and 210 according to some embodiments. Negative internal capacitor plane 200 may be identical to capacitor plane 100 except for the presence of void 207. Void 207 is adjacent to negative terminal 202. Positive internal capacitor plane 210 may be identical to capacitor plane 110 except for void 217 adjacent to positive terminal 212.

FIGS. 5C and 5D illustrate capacitor 220 comprising external planes 10 and 20 and internal planes 200 and 210. Capacitor 220 may therefore be constructed similarly to capacitor 120 of FIGS. 3C and 3D, with internal planes 200 and 210 being substituted for respective ones of planes 100 and 110. Voids 207 and 217 may increase the ESR of capacitor 220. The magnitude of the increase may be controlled by controlling the dimensions of voids 207 and/or 217. Generally, the total ESR of such a capacitor increases as the total area of the voids increases. According to some embodiments, the ESR of capacitor 220 may be designed to more effectively and/or more efficiently reduce resonance of a power delivery system to which capacitor 220 is coupled.

In some embodiments of method 150, capacitor plane 200 is fabricated at 154 and terminal 202 is coupled to terminal 12 of plane 10 at 156. Capacitor plane 200 may be fabricated according to any suitable method and composed of any suitable materials as described above with respect to capacitor plane 100. For example, plane 200 (and void 207) may be defined by stamping a metal die onto a sheet of conductive material. Capacitor plane 210 may also be fabricated at 154 and terminal 212 may also be coupled to terminal 22 of plane 20 at 156. Method 150 may therefore be executed during the fabrication of capacitor 220.

FIGS. 6A through 6D illustrate the construction of an eight-terminal capacitor according to some embodiments. Specifically, FIG. 6A is a top view of negative internal capacitor plane 300. Negative internal capacitor plane 300 includes negative terminal 302 and defines void 305. Positive internal capacitor plane 310 of FIG. 6B includes positive terminal 312 and defines void 315. Planes 300 and 310 may comprise any suitable currently- or hereafter-known material or materials, including but not limited to copper. Terminals 302 and 312 may comprise materials that are different, similar, or identical to non-terminal areas of their respective planes.

FIG. 6C is a side cutaway view of capacitor 320 according to some embodiments. Negative external capacitor plane 50 of FIG. 2A is disposed at the bottom of capacitor 320 and positive plane 60 of FIG. 2B is above plane 50 and separated therefrom by dielectric 80. As previously mentioned, plane 50 includes negative terminals 52 and plane 60 includes positive terminals 62.

Internal negative capacitor plane 300a is located above plane 60 and is coupled to external plane 50. In this regard, terminal 302a of internal capacitor plane 300a is electrically coupled to terminal 52 of external capacitor plane 50. Internal positive capacitor plane 310a is located above plane 300a and is coupled to lower-most positive capacitor plane 60 by coupling terminal 312a of internal capacitor plane 310a to terminal 62 of capacitor plane 60. In some embodiments, a conductor that couples terminal 312a to terminal 62 passes through void 305a (not shown) of plane 300a in order to avoid electrically coupling plane 300a to terminal 312a or terminal 62.

FIG. 2A and FIG. 6A show that a total area of terminal 302 is less than a total area of terminal 52. As a result, capacitor 320 may exhibit a greater ESR than capacitor 70. A total area of terminal 312 is less than a total area of terminal 62, which may also or alternatively increase the ESR of capacitor 320 with respect to other arrangements.

Continuing with the description of FIG. 3C, internal negative capacitor plane 300b is located between internal positive capacitor plane 310a and internal positive capacitor plane 310b. Terminal 302b of internal capacitor plane 300b is electrically coupled to terminal 302a and terminal 52 of lower-most external capacitor plane 50. A conductor that couples terminal 302b to terminal 302a passes through void 315a (not shown) of plane 310a in order to avoid electrically coupling plane 310a to terminal 302a or terminal 302b.

Furthermore, internal positive capacitor plane 310b is located above plane 300b and is coupled to lower-most positive capacitor plane 60 and to internal positive capacitor plane 310a. More specifically, terminal 312b of internal positive capacitor plane 310b is electrically coupled to terminal 312a of capacitor plane 310a by a conductor that passes through void 305b (not shown) of plane 300b.

Upper-most external negative capacitor plane 50 and upper-most external positive capacitor plane 60 are respectively coupled to the other negative and positive capacitor planes of FIG. 6C. In some embodiments, a total area of terminal 52 of the upper-most external negative capacitor plane 50 is greater than a total area of terminal 312a or terminal 312b. A total area of terminal 62 of the upper-most external positive capacitor plane 60 may also or alternatively be greater than a total area of terminal 302a or terminal 302b.

A top view of capacitor 320 is shown in FIG. 6D. The view shows four negative terminals 52 of an external negative capacitor plane 50 and four positive terminals 62 of an external positive capacitor plane 60. The eight terminals may be used to connect capacitor 320 to an external circuit.

Method 150 may be executed during the fabrication of capacitor 320. According to some embodiments of method 150, internal negative capacitor plane 300 is fabricated at 154 and terminal 302 is coupled to terminal 52 of plane 50 at 156. Capacitor plane 300 may be fabricated according to any suitable method and composed of any suitable materials as described above with respect to capacitor planes 10, 20, 50 and 60. Capacitor plane 310 may also be fabricated at 154 and terminal 312 may also be coupled to terminal 62 of plane 60 at 156.

FIGS. 7A through 7D illustrate the construction of an eight-terminal capacitor according to some embodiments. More specifically, FIG. 7A and FIG. 7B show internal capacitor planes 400 and 410 according to some embodiments. Negative internal capacitor plane 400 may be identical to capacitor plane 300 except for the presence of voids 407. Voids 407 are adjacent to negative terminal 402. Positive internal capacitor plane 410 may be identical to capacitor plane 310 except for voids 417 adjacent to positive terminal 412.

FIGS. 7C and 7D illustrate capacitor 420 comprising external planes 50 and 60 and internal planes 400 and 410. Capacitor 420 may therefore be constructed similarly to capacitor 320 of FIGS. 6C and 6D, with internal planes 400 and 410 being substituted for respective ones of planes 300 and 310. Voids 407 and 417 may increase the ESR of capacitor 420. The number and dimensions of the respective voids may be specified such that capacitor 420 exhibits a desired ESR. Generally, the total ESR of such a capacitor increases as the total area of the voids increases. According to some embodiments, the ESR of capacitor 420 may be designed to more effectively and/or more efficiently reduce resonance of a power delivery system to which capacitor 420 is coupled.

In some embodiments of method 150, capacitor plane 400 is fabricated at 154 and terminal 402 is coupled to terminal 52 of plane 50 at 156. Capacitor plane 400 may be fabricated according to any suitable method and composed of any suitable materials as described above with respect to capacitor plane 300. For example, plane 400 (and voids 407) may be defined by stamping a metal die onto a sheet of conductive material. Capacitor plane 410 may also be fabricated at 154 and terminal 412 may also be coupled to terminal 62 of plane 60 at 156. Method 150 may therefore be executed during the fabrication of capacitor 420.

FIG. 9 is a side elevation of system 500 according to some embodiments. System 500 includes integrated circuit die 600, integrated circuit package 700, motherboard 800 and memory 900. Integrated circuit die 600 may be fabricated using any suitable substrate material and fabrication technique and may provide any functions to system 500. In some embodiments, integrated circuit die 600 is a microprocessor die having a silicon substrate.

Integrated circuit package 700 may comprise any ceramic, organic, and/or other suitable material. Package 700 is electrically coupled to circuit elements of die 600 by Controlled Collapse Chip Connect (C4) solder bumps 750. In some embodiments, integrated circuit package 700 is electrically coupled to circuit elements of die 600 via wirebonds.

Decoupling capacitors 320 are coupled to integrated circuit package 700. Capacitors 320 may comprise surface-mount capacitors for mounting to conductive contacts of circuit boards and/or integrated circuit packages. Positive and negative terminals of each of capacitors 320 are coupled to respective conductive contacts of integrated circuit package 700. According to some embodiments, the conductive contacts are coupled in turn to a power delivery circuit of package 700. Some embodiments of the foregoing may reduce resonance between package 700 and motherboard 800 more effectively and/or more efficiently than conventional systems. One or more of capacitors 320 may be substituted with one or more capacitors structured similarly to above-described capacitors 120, 220 or 420.

Pins 750 couple package 700 to motherboard 800. Pins 750 may carry power and other electrical signals between motherboard 800 and die 600. In some embodiments, pins 750 interface with a socket (not shown) of motherboard 800. According to some embodiments, integrated circuit package 700 is a surface-mountable substrate such as an Organic Land Grid Array substrate that may be mounted directly on motherboard 800 or mounted on a pinned interposer which mates with a socket of motherboard 800. Packaging systems other than those mentioned above may be used in conjunction with some embodiments.

Motherboard 800 may comprise a memory bus (not shown) coupled to pins 750 and to memory 900. In operation, motherboard 800 may route input/output and power signals to pins 750 for transmission to integrated circuit die 600 through integrated circuit package 700. Memory 900 may comprise any type of memory for storing data, such as a Single Data Rate Random Access Memory, a Double Data Rate Random Access Memory, or a Programmable Read Only Memory.

The several embodiments described herein are solely for the purpose of illustration. Embodiments may include any currently or hereafter-known versions of the elements described herein. Therefore, persons in the art will recognize from this description that other embodiments may be practiced with various modifications and alterations.

What is claimed is:

1. A capacitor comprising:
    a first external capacitor plane of a first polarity comprising a first at least one terminal of the first polarity, a total area of the first external capacitor plane of the first polarity being greater than a total area of the first at least one terminal of the first polarity; and
    a first internal capacitor plane comprising a second at least one terminal of the first polarity, the second at least one terminal of the first polarity being electrically coupled to the first at least one terminal of the first polarity,
    wherein a total area of the second at least one terminal of the first polarity is less than the total area of the first at least one terminal of the first polarity.

2. A capacitor according to claim 1, wherein the first at least one terminal comprises only one terminal of the first polarity, and
    wherein the second at least one terminal comprises only one terminal of the first polarity.

3. A capacitor according to claim 2, wherein the first internal capacitor plane defines a void adjacent to one of the second at least one terminal of the first polarity.

4. A capacitor according to claim 1, wherein the first internal capacitor plane defines a void adjacent to one of the second at least one terminal of the first polarity.

5. A capacitor, comprising:
    a first external capacitor plane comprising a first at least one terminal of a first polarity; and
    a first internal capacitor plane comprising a second at least one terminal of the first polarity, the second at least one terminal of the first polarity being electrically coupled to the first at least one terminal of the first polarity,
    wherein a total area of the second at least one terminal of the first polarity is less than a total area of the first at least one terminal of the first polarity,
    wherein the first at least one terminal comprises M (M>1) terminals of the first polarity, and
    wherein the second at least one terminal comprises N (N<M) terminals of the first polarity.

6. A capacitor according to claim 5, wherein the first internal capacitor plane defines a void adjacent to one of the second at least one terminal of the first polarity.

7. A capacitor according to claim 5, wherein M=4 and N=1.

8. A capacitor comprising:
    a first external capacitor plane comprising a first at least one terminal of a first polarity;
    a first internal capacitor plane comprising a second at least one terminal of the first polarity, the second at least one terminal of the first polarity being electrically coupled to the first at least one terminal of the first polarity,
    a second external capacitor plane comprising a first at least one terminal of a second polarity; and
    a second internal capacitor plane disposed between the first external capacitor plane and the first internal capacitor plane, the second internal capacitor plane comprising a second at least one terminal of the second polarity, the second at least one terminal of the second polarity being electrically coupled to the first at least one terminal of the second polarity,
    wherein the first external capacitive plane is disposed above the second internal capacitive plane, the second internal capacitive plane is disposed above the first internal capacitive plane, and the first internal capacitor plane is disposed above the second external capacitive plane,
    wherein a total area of the second at least one terminal of the first polarity is less than a total area of the first at least one terminal of the first polarity, and
    wherein a total area of the second at least one terminal of the second polarity is less than a total area of the first at least one terminal of the second polarity.

9. A capacitor according to claim 8, wherein the first internal capacitor plane defines a first void adjacent to one of the second at least one terminal of the first polarity, and
    wherein the second internal capacitor plane defines a second void adjacent to one of the second at least one terminal of the second polarity.

10. A method comprising:
    fabricating a first external capacitor plane of a first polarity comprising a first at least one terminal of the first polarity, a total area of the first external capacitor plane of the first polarity being greater than a total area of the first at least one terminal of the first polarity;
    fabricating a first internal capacitor plane comprising a second at least one terminal of the first polarity, a total area of the second at least one terminal of the first polarity being less than the total area of the first at least one terminal of the first polarity; and
    electrically coupling the second at least one terminal of the first polarity to the first at least one terminal of the first polarity.

11. A method according to claim 10, wherein the first at least one terminal comprises only one terminal of the first polarity, and
    wherein the second at least one terminal comprises only one terminal of the first polarity.

12. A method according to claim 11, wherein the first internal capacitor plane defines a void adjacent to one of the second at least one terminal of the first polarity.

13. A method according to claim 10, wherein the first internal capacitor plane defines a void adjacent to one of the second at least one terminal of the first polarity.

14. A method comprising:
    fabricating a first external capacitor plane comprising a first at least one terminal of a first polarity;
    fabricating a first internal capacitor plane comprising a second at least one terminal of the first polarity, a total area of the second at least one terminal of the first polarity being less than a total area of the first at least one terminal of the first polarity; and
    electrically coupling the second at least one terminal of the first polarity to the first at least one terminal of the first polarity,
    wherein the first at least one terminal comprises M (M>1) terminals of the first polarity, and
    wherein the second at least one terminal comprises N (N<M) terminals of the first polarity.

15. A method according to claim 14, wherein the first internal capacitor plane defines a void adjacent to one of the second at least one terminal of the first polarity.

16. A method according to claim 14, wherein M=4 and N=1.

17. A method comprising:
fabricating a first external capacitor plane comprising a first at least one terminal of a first polarity;
fabricating a first internal capacitor plane comprising a second at least one terminal of the first polarity, a total area of the second at least one terminal of the first polarity being less than a total area of the first at least one terminal of the first polarity;
electrically coupling the second at least one terminal of the first polarity to the first at least one terminal of the first polarity;
fabricating a second external capacitor plane comprising a first at least one terminal of a second polarity;
fabricating a second internal capacitor plane comprising a second at least one terminal of the second polarity, a total area of the second at least one terminal of the second polarity being less than a total area of the first at least one terminal of the second polarity;
electrically coupling the second at least one terminal of the second polarity to the first at least one terminal of the second polarity; and
alternately stacking the first external capacitor plane, the second external capacitor plane, the first internal capacitor plane, and the second internal capacitor plane with dielectric material therebetween.

18. A method according to claim 17, wherein the first internal capacitor plane defines a first void adjacent to one of the second at least one terminal of the first polarity, and
wherein the second internal capacitor plane defines a second void adjacent to one of the second at least one terminal of the second polarity.

19. A system comprising:
a microprocessor die;
an integrated circuit package coupled to the microprocessor die;
a decoupling capacitor coupled to the integrated circuit package, the decoupling capacitor comprising:
a first external capacitor plane of a first polarity comprising a first at least one terminal of the first polarity, a total area of the first external capacitor plane of the first polarity being greater than a total area of the first at least one terminal of the first polarity; and
a first internal capacitor plane comprising a second at least one terminal of the first polarity, the second at least one terminal of the first polarity being electrically coupled to the first at least one terminal of the first polarity, a total area of the second at least one terminal of the first polarity being less than the total area of the first at least one terminal of the first polarity; and
a double data rate memory coupled to the integrated circuit package.

20. A system according to claim 19, wherein the first at least one terminal comprises only one terminal of the first polarity, and
wherein the second at least one terminal comprises only one terminal of the first polarity.

21. A system comprising:
a microprocessor die;
an integrated circuit package coupled to the microprocessor die;
a decoupling capacitor coupled to the integrated circuit package, the decoupling capacitor comprising:
a first external capacitor plane comprising a first at least one terminal of a first polarity; and
a first internal capacitor plane comprising a second at least one terminal of the first polarity, the second at least one terminal of the first polarity being electrically coupled to the first at least one terminal of the first polarity, a total area of the second at least one terminal of the first polarity being less than a total area of the first at least one terminal of the first polarity;
wherein the first at least one terminal comprises M (M>1) terminals of the first polarity, and
wherein the second at least one terminal comprises N (N<M) terminals of the first polarity; and
a double data rate memory coupled to the integrated circuit package.

22. A system comprising:
a microprocessor die;
an integrated circuit package coupled to the microprocessor die;
a decoupling capacitor coupled to the integrated circuit package, the decoupling capacitor comprising:
a first external capacitor plane comprising a first at least one terminal of a first polarity;
a first internal capacitor plane comprising a second at least one terminal of the first polarity, the second at least one terminal of the first polarity being electrically coupled to the first at least one terminal of the first polarity, a total area of the second at least one terminal of the first polarity being less than a total area of the first at least one terminal of the first polarity;
a second external capacitor plane comprising a first at least one terminal of a second polarity; and
a second internal capacitor plane disposed between the first external capacitor plane and the first internal capacitor plane, the second internal capacitor plane comprising a second at least one terminal of the second polarity, the second at least one terminal of the second polarity being electrically coupled to the first at least one terminal of the second polarity,
wherein the first external capacitive plane is disposed above the second internal capacitive plane, the second internal capacitive plane is disposed above the first internal capacitive plane, the first internal capacitor plane is disposed above the second external capacitive plane, and a total area of the second at least one terminal of the second polarity is less than a total area of the first at least one terminal of the second; and
a double data rate memory coupled to the integrated circuit package.

* * * * *